US008686848B2

(12) United States Patent
Grundmann et al.

(10) Patent No.: US 8,686,848 B2
(45) Date of Patent: Apr. 1, 2014

(54) ELECTRIC MOTOR VEHICLE HAVING A DISPLAY DEVICE

(75) Inventors: Holmer-Geert Grundmann, Babenhausen (DE); Hannes Lüttringhaus, Maintal (DE); Otmar Schreiner, Griesheim (DE)

(73) Assignee: Continental Automotive GmbH, Hannover (DE)

( * ) Notice: Subject to any disclaimer, the term of this patent is extended or adjusted under 35 U.S.C. 154(b) by 11 days.

(21) Appl. No.: 13/335,671

(22) Filed: Dec. 22, 2011

(65) Prior Publication Data
US 2012/0161956 A1   Jun. 28, 2012

(30) Foreign Application Priority Data

Dec. 23, 2010   (DE) .......................... 10 2010 055 797

(51) Int. Cl.
*B60Q 1/00*   (2006.01)
(52) U.S. Cl.
USPC ....................... 340/455; 340/825.72; 340/988
(58) Field of Classification Search
USPC ............ 340/455, 825.72, 953, 479, 468, 431, 340/531, 439, 438, 901–902, 988, 933, 942
See application file for complete search history.

(56) References Cited

U.S. PATENT DOCUMENTS

| 4,210,908 | A |   | 7/1980 | Sakakibara |
|---|---|---|---|---|
| 5,283,513 | A | * | 2/1994 | Fujita et al. .................... 320/138 |
| 5,347,293 | A | * | 9/1994 | Wiedemann et al. ........... 345/87 |
| 5,539,399 | A |   | 7/1996 | Takahira et al. |
| 5,596,261 | A | * | 1/1997 | Suyama ......................... 320/152 |
| 5,754,117 | A | * | 5/1998 | Inamori et al. ................ 340/12.5 |
| 5,757,595 | A | * | 5/1998 | Ozawa et al. .............. 340/636.1 |
| 2003/0085854 | A1 | * | 5/2003 | Tsuji ................................. 345/82 |
| 2003/0137278 | A1 |   | 7/2003 | Kondo |
| 2005/0200201 | A1 | * | 9/2005 | Jabaji et al. .................. 307/10.1 |
| 2010/0106353 | A1 |   | 4/2010 | Watson et al. |
| 2010/0277495 | A1 |   | 11/2010 | Taguchi et al. |

FOREIGN PATENT DOCUMENTS

| DE | 10 2009 060 313 | 7/2010 |
| GB | 2 466 561 A | 6/2010 |
| WO | WO 2010/130743 A2 | 11/2010 |

* cited by examiner

*Primary Examiner* — Daniel Previl
(74) *Attorney, Agent, or Firm* — Cozen O'Connor

(57) ABSTRACT

An electric motor vehicle with an electric drive motor, an accumulator for storing electrical energy, an optical display device having a plurality of individually actuable lighting segments, and a display control device. To acquire important vehicle information easily and reliably by the display device, the lighting segments are arranged in such a way that they form an at least two-dimensional lighting segment field and irradiate light upward in the vertical direction. The display control device actuates the lighting segments of the lighting segment field such that the lighting segment field outputs a nondigital accumulator charge state information item and/or a nondigital vehicle operating state information item.

8 Claims, 1 Drawing Sheet

ELECTRIC MOTOR VEHICLE HAVING A DISPLAY DEVICE

BACKGROUND OF THE INVENTION

1. Field of the Invention

The invention relates to an electric motor vehicle with an electric drive motor, an accumulator for storing electrical energy for operating the electric drive motor, an optical display device having a plurality of individually actuatable lighting segments, and a display control device.

2. Description of the Related Art

Document DE 10 2009 060 313 A1 discloses an electric motor vehicle driven by operating an engine using a battery as a power source, having a charge display device. The charge display device has a measuring device arrangement capable of displaying a speed of the electric vehicle and a charge state display device provided on the measuring device arrangement and configured to display a charge state of the battery.

U.S. Pat. No. 5,757,595 discloses a device for displaying the charging of a battery of an electric vehicle, wherein a display panel with a numerical display for displaying the charge state of the battery is arranged next to a charge connection on an outer side of the electric vehicle.

SUMMARY OF THE INVENTION

The invention is based providing an electric motor vehicle of the type specified at the beginning for which important vehicle information items can be displayed by the display device in such a way that they can be perceived particularly easily and reliably.

According to one embodiment of the invention an electric motor vehicle includes lighting segments arranged in such a way that they form an at least two-dimensional lighting segment field and irradiate light upward in the vertical direction. The display control device is designed to actuate the lighting segments of the lighting segment field in such a way that the lighting segment field outputs a nondigital accumulator charge state information item and/or a nondigital vehicle operating state information item.

Of particular advantage with the invention is, on the one hand, the provision of the lighting segment field and therefore of a planar lighting device that can easily be perceived and has a considerable effect of attracting attention in a display situation and, on the other hand, the arrangement of the lighting segments in such a way that this light is irradiated vertically upward, that is to say the lighting segments irradiate light upward in the direction of the vertical axis of the vehicle. As a result, the lighting segment field, which is arranged inside the vehicle and fixed to the vehicle, and the information item which is output thereby can not only be perceived very well within the electric vehicle, which is particularly advantageous, in particular, in the case of a traveling electric vehicle or an electric vehicle which is beginning to travel, but also the information item which is output by the lighting segment field can be perceived very well from outside the electric vehicle without making changes to the display device, which is of particular advantage, in particular, in the case of a stationary electric vehicle, above all during a charging process of the accumulator.

Compared to a bar display (if appropriate also bent or curved), the invention significantly increases the effect whereby the outputting of information attracts attention by providing a lighting segment field, that is to say a planar lighting device. The driver of the electric motor vehicle can perceive the display, for example, as a pulsating spot of light.

The perceptibility of the information output item is also particularly promoted by the nondigital information output according to the invention, which therefore completely dispenses with a numerical display. The lighting segment field can be of planar design, however, it is, for example, also conceivable to have a curved or dome-shaped design of the lighting segment field, as a result of which the lighting segment field is given a three-dimensional shape.

One embodiment of the invention makes it possible for the driver of the electric motor vehicle to perceive the particularly important information items of the accumulator charge state information and/or vehicle operating state information in an enduring and sensory fashion without overloading the driver with technical details such as, for example, a display of precise measured values. The display of the information item occurs basically in a qualitative fashion. Also, the display, to be precise in particular the lighting segment field, does not have to be arranged in the direct field of vision of the driver of the electric motor vehicle. It is sufficient for the display to be recognized in the peripheral vision of the driver, and is even desired in order to avoid unnecessarily running the risk that the driver will possibly be distracted from the events on the road. With the invention it is possible, for example, for instantaneous consumption, that is to say the instantaneous electric power demand, and/or the instantaneous performance capability of the electric motor vehicle, to be displayed qualitatively.

According to one embodiment of the invention a clearly visible display element, formed by the lighting segment field, can easily indicate operational readiness of the electric motor vehicle by illuminating. Such illuminating, which outputs the nondigital vehicle operating state information item, can be subject, for example, to chronological changes and/or spatial changes (that is to say not all or not the same lighting segments of the lighting segment field always light up) and/or color changes, which changes preferably have a direct relationship with an instantaneous operating state of the electric motor vehicle. Such a situation can be brought about by evaluating respective current values of a vehicle sensor system and/or respective current performance data including speed and/or energy consumption and/or selected operating mode. With the invention it is, for example, not necessary to artificially generate an engine noise in the electric motor vehicle in order to give the driver an indication of the operational readiness of the vehicle.

In the context of charging the accumulator, it is advantageous that the clearly visible display element formed by the lighting segment field can display a current charging process by illuminating in a simple but effective fashion. Such illumination outputs the nondigital accumulator charge state information item and can also be subject to chronological changes and/or spatial changes (that is to say not all or not the same lighting segments of the lighting segment field always light up) and/or color changes, which changes preferably have a direct relationship with an instantaneous charge state of the accumulator of the electric motor vehicle. Such a situation can be brought about by evaluating respective current values of a vehicle sensor system and/or respective current performance data, for example accumulator charge state and/or quantity of energy and/or selected charging mode.

It would be possible to imagine that the lighting segment field has an unplanned and unregulated arrangement of lighting segments. According to one advantageous development of the invention, the lighting segment field is, on the other hand, in the form of a matrix. The lighting segments of the lighting segment field are therefore arranged in a matrix shape, that is to say the lighting segments are arranged according to an ordered pattern. A particularly differentiated information output is therefore possible with the lighting segment field.

It is conceivable that the lighting segment field is on a center console between a driver's seat and a front passenger's seat of the electric motor vehicle. In contrast, in respect of making the information output by the lighting segment field particularly well perceived both in the passenger compartment of the electric motor vehicle and from the outside of the vehicle, it is advantageous if, according to one embodiment of the invention, the lighting segment field is arranged on a dashboard of the electric motor vehicle. The lighting segment field can preferably be arranged at a center of the dashboard with respect to the width of the vehicle.

The lighting segment field is arranged under a cover glass or a film. To protect the lighting segment field not only against mechanical damage but also to increase the effect of attracting attention and to improve the perceptibility of information items which are output with the lighting segment field it is particularly advantageous if, according to one embodiment of the invention, a dome-shaped lighting segment field cover engages over the lighting segment field and through which light from the lighting segments can pass.

Another embodiment of the invention provides that the lighting segments of the lighting segment field are each formed by a lighting unit, wherein the lighting units are designed to respectively light up in different colors. As a result, a particularly differentiated information output of the lighting segment field can advantageously take place. A light display by the lighting segment field is brought about here by multi-color lighting units preferably arranged in the form of a matrix and which each form a lighting segment. The lighting units can be, for example, RGB-LEDs or be constructed using OLED or TFT technology.

According to one embodiment of the invention, a transmitter unit connected to the display control device and a mobile display device are provided. The transmitter unit is designed to wirelessly couple the display device, and the display device is designed to display the accumulator charge state information item and/or the vehicle operating state information item. With this development it is possible for a driver of the electric motor vehicle carrying the mobile display device to perform different tasks during the duration of charging of the accumulator and at the same time continue to be informed about the charging process via the mobile display device. The respective information item is preferably output both with the lighting segment field (inside the vehicle and fixed to the vehicle) and with the mobile display device; however, in each case the information item is output at least with the lighting segment field (inside the vehicle and fixed to the vehicle). The mobile display device can be a smart phone or a vehicle key.

Alternatively it is also conceivable that a mobile display device is not used but rather an immobile display device which is, however, not arranged on the vehicle but is external to the vehicle, such as a display device integrated into a charging station for the electric motor vehicle; in this case, the display device could be coupled to the transmitter unit in a wireless fashion or by an electric cable.

It is particularly advantageous for informing the driver of the electric motor vehicle in a reliable and easily perceived fashion about the selection of the longitudinal direction of travel which applies at the respective time if, according to another embodiment of the invention, the display control device is designed to actuate the lighting segments such that the lighting segment field displays a selection of the longitudinal direction of travel for the electric motor vehicle as a vehicle operating state information item. The particular advantage for the driver here is, on the one hand, an indication that the electric motor vehicle is basically ready to move (that is to say activation of a gas pedal of the electric motor vehicle gives rise to a movement of the vehicle) and also knowledge about the anticipated direction of movement (forward or backward). The selection of the longitudinal direction of travel can, for example, be indicated by direction-dependent upward movement or downward movement of a point of light which is generated in the lighting segment field by lighting up a lighting segment.

According to one embodiment of the invention, the display control device is designed to actuate the lighting segments such that the lighting segment field displays an ongoing charging process of the accumulator as an accumulator charge state information item. The particularly important information about the progress of a charging process can always be conveyed to the driver of the electric motor vehicle in a reliable and easily recognizable fashion in this way, irrespective of whether the driver is located within the electric motor vehicle or outside the electric motor vehicle.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment of the invention is illustrated in the drawing and will be described in more detail below. In said drawing.

Corresponding elements are provided with respectively identical reference symbols in all the figures.

DETAILED DESCRIPTION OF THE PRESENTLY PREFERRED EMBODIMENTS

Figure 1:
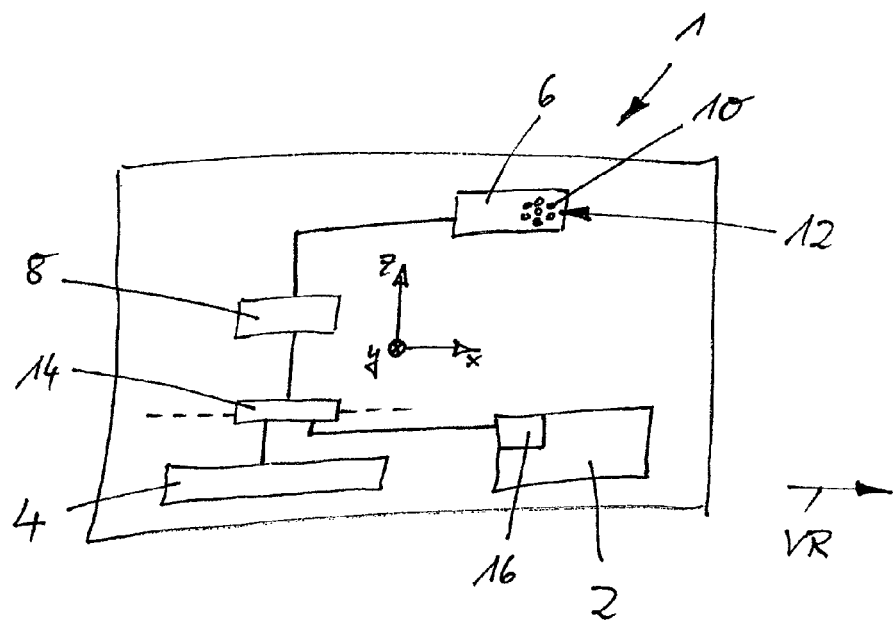
FIG. 1 is a schematic illustration of electric motor vehicle.

FIG. 1 shows an electric motor vehicle 1 with an electric drive motor 2 and an accumulator 4 for storing electrical energy for operating the electric drive motor 2. An arrow VR indicates the direction of forward travel of the electric motor vehicle 1. Furthermore, a vehicle coordinate system is entered, wherein the x axis of the vehicle coordinate system points in the direction of forward travel, the y axis to the left with respect to the direction of forward travel, and the z axis indicates the vertical axis of the vehicle and points upward in the vertical direction.

An optical display device 6 (see also FIG. 2) is connected to a display control device 8. The optical display device 6 has a plurality of lighting segments 10 that form a two-dimensional lighting segment field 12. The lighting segments 10 of the lighting segment field 12 can be actuated individually by the display control device 8. The display control device 8 is also connected via a vehicle bus 14 to the accumulator 4 and to a motor electronics control device 16 of the electric drive motor 2.

Figure 2:
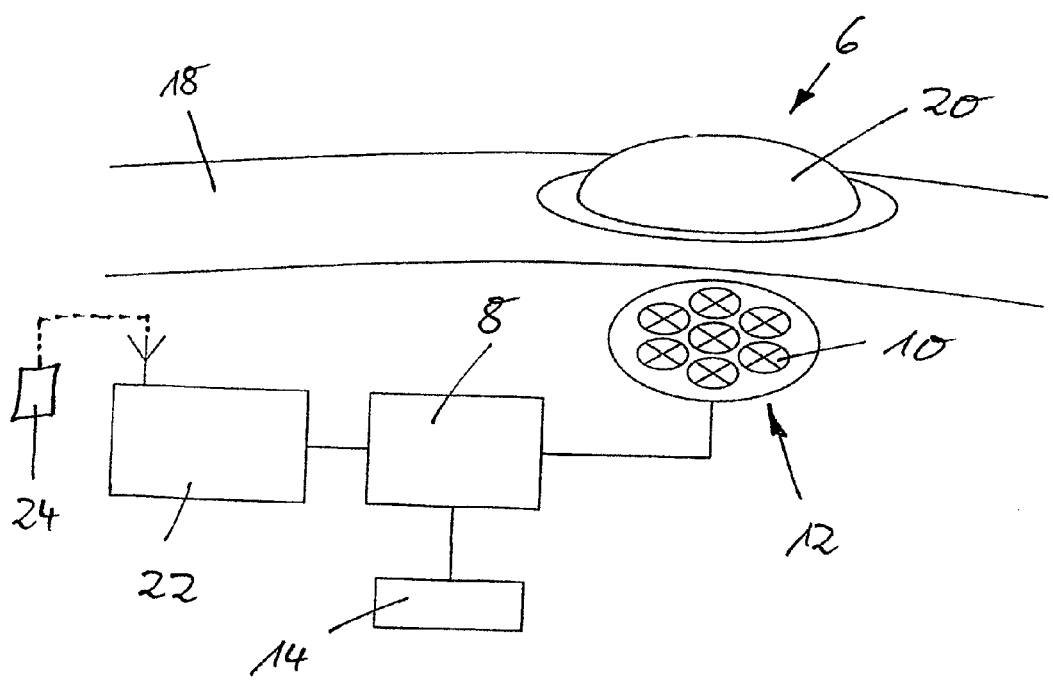
FIG. 2 is a schematic illustration of a detail of the electric motor vehicle according to FIG. 1 with a lighting segment field.

Furthermore, in FIG. 2, which shows an enlarged detail from the electric motor vehicle 1 according to FIG. 1, it is clearly recognizable that the lighting segment field 12 of the optical display device 6 is arranged on a dashboard 18 of the electric motor vehicle 1. The lighting segment field 12 has the shape of a matrix, that is to say the lighting segments 10 of the lighting segment field 12 are arranged according to an ordered pattern. Furthermore, the display device 6 has a dome-shaped lighting segment field cover 20 which engages over the lighting segment field 12 and through which light from the lighting segments 10 can pass. The display control device 8 is designed to actuate the lighting segments 10 of the lighting segment field 12 in such a way that the lighting segment field 12 outputs a nondigital accumulator charge state information item and/or a nondigital vehicle operating state information item.

In addition, in the electric motor vehicle there is a transmitter unit 22 connected to the display control device 8, and a mobile display device 24 that can be removed from the electric motor vehicle, wherein the transmitter unit 22 is designed to couple the display device 24 in a wireless fashion, and the display device 24 is designed to display the accumulator charge state information item and/or the vehicle operating state information item. The wireless coupling of the display device 24 to the transmitter unit 22 and therefore to the display control device 8 is possible independently of whether the display device 24 is in the electric motor vehicle or outside the same.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electric motor vehicle comprising:
    an electric drive motor;
    an accumulator for storing electrical energy to operate the electric drive motor;
    an optical display device having a plurality of individually actuatable lighting segments, the plural lighting segments arranged so as to form an at least two-dimensional lighting segment field and irradiate light in a vertical upward direction; and
    a display control device that actuates the lighting segments of the lighting segment field such that the lighting segment field outputs at least a nondigital accumulator charge state information item,
    wherein the display control device actuates the lighting segments such that the lighting segment field changes in a manner representative of an ongoing charging process of the accumulator as the accumulator charge state information item, the changes having a direct relationship with an instantaneous charge state of the accumulator.

2. The electric motor vehicle as claimed in claim 1, wherein the lighting segment field is arranged as a matrix.

3. The electric motor vehicle as claimed in claim 2, wherein the lighting segment field is arranged on a dashboard of the electric motor vehicle.

4. The electric motor vehicle as claimed in claim 1, wherein the lighting segment field is arranged on a dashboard of the electric motor vehicle.

5. The electric motor vehicle as claimed in claim 1, further comprising a dome-shaped lighting segment field cover that engages over the lighting segment field and through which light from the plural lighting segments can pass.

6. The electric motor vehicle as claimed in claim 1, wherein the plural lighting segments of the lighting segment field are formed by respective lighting units, wherein the lighting units are configured to light up in different colors.

7. The electric motor vehicle as claimed in claim 1, further comprising:
    a transmitter unit coupled to the display control device; and
    a mobile display device that displays at least one of the accumulator charge state information item and a vehicle operating state information item, wherein the transmitter unit is designed to wirelessly couple the display device.

8. The electric motor vehicle as claimed in claim 1, wherein the lighting segment field outputs a nondigital vehicle operating state information item, wherein the display control device actuates the lighting segments such that the lighting segment field displays a selection of a longitudinal direction of travel for the electric motor vehicle as the vehicle operating state information item.

* * * * *